(12) United States Patent
Powell

(10) Patent No.: US 6,423,617 B1
(45) Date of Patent: Jul. 23, 2002

(54) IN-SITU USE OF DICHLOROETHENE AND $NH_3$ IN AN $H_2O$ STEAM BASED OXIDATION SYSTEM TO PROVIDE A SOURCE OF CHLORINE

(75) Inventor: Don Carl Powell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 5 days.

(21) Appl. No.: 09/575,708

(22) Filed: Jul. 20, 2000

(51) Int. Cl.[7] ............................................. H01L 21/322
(52) U.S. Cl. ..................... 438/476; 438/239; 438/240; 438/253; 438/720; 438/762; 438/791
(58) Field of Search .................. 438/476, 239, 438/720, 253, 762, 240, 791

(56) References Cited

U.S. PATENT DOCUMENTS

| | | | |
|---|---|---|---|
| 5,445,679 A | 8/1995 | Hansen et al. ................ 134/1 |
| 5,679,215 A | * 10/1997 | Barnes et al. ............. 156/646.1 |
| 5,753,567 A | * 5/1998 | Banan et al. ................ 438/720 |
| 6,132,811 A | * 10/2000 | Schellenberger et al. ... 427/443 |
| 6,300,187 B2 | * 10/2001 | Smith ......................... 438/239 |
| 2001/0003661 A1 | * 6/2001 | Smith ......................... 438/239 |

* cited by examiner

Primary Examiner—Richard Elms
Assistant Examiner—Pho M. Luu
(74) Attorney, Agent, or Firm—Knobbe, Martens, Olson & Bear, LLP

(57) ABSTRACT

A method of using dichloroethene and ammonia to provide chlorine and nitrogen during the growth of an in-situ hardened gate dielectric. The method provides a gaseous source of gettering agent and a gaseous source of dielectric strengthening agent that are compatible with each other and can be used during the formation of in-situ hardened dielectric or the strengthening of an already formed dielectric.

9 Claims, 1 Drawing Sheet

IN-SITU USE OF DICHLOROETHENE AND NH₃ IN AN H₂O STEAM BASED OXIDATION SYSTEM TO PROVIDE A SOURCE OF CHLORINE

BACKGROUND OF THE INVENTION

1. Field of the Invention

The present invention relates to silicon integrated circuit processing, and, more particularly, to a method of forming a semiconductor dielectric in the presence of both gettering and strengthening agents.

2. Description of Related Art

In semiconductor processing, the formation of a gate dielectric typically includes using dry/wet/dry growth techniques to grow an oxide on a substrate surface. In order to form a high quality, low defect gate dielectric, many oxide growth techniques entail using a chlorine source in the process gas flow. In particular, chlorine and other halogens can be introduced to the substrate/oxide interface during oxidation to getter the metallic contaminants that are inadvertently deposited on the wafer surface. Gettering agents, such as chlorine, are used to passivate the metal contaminants and thereby reduce the metal's tendency to attract loose electrons. Alternatively, gettering agents in some cases are used to vaporize the metal contaminants and lift the contaminants off the wafer surface altogether. Without the gettering process, metallic contaminants are known to attract electrons into the dielectric and adversely affect the threshold voltage of the gate structure. As such, gettering of metallic contaminants is essential for the formation of a high quality gate dielectric.

However, the gate dielectric thus formed can still be susceptible to hot electron degradation and dopant penetration which can reduce reliability of the gate dielectric and ultimately cause electrical failures in the device. A hot electron is a high energy charge carrier that is travelling in the channel region of the substrate between the source and drain that is attracted into the gate dielectric and can damage the gate dielectric thereby affecting the performance of the transistor. In particular, a gate dielectric formed of silicon dioxide, for instance, can trap hot electrons via the dangling silicon bonds. The trapped hot electrons have shown to degrade the oxide and erode its insulating properties. Similarly, the gate oxide can also permit dopants such as boron to diffuse into the underlying channel which can alter the threshold voltage of the channel and render the device less reliable.

To address the problems associated with gate dielectric degradation, nitrogen containing compounds are commonly incorporated into the gate oxide to strengthen the lattice structure of the dielectric so as to form a gate dielectric that is resistant to hot electron injection and boron diffusion. This gate dielectric strengthening process is commonly known as gate hardening and is typically performed after gate oxide formation. For instance, the gate hardening process for a gate dielectric that is primarily made of silicon dioxide ($SiO_2$) typically comprises subjecting $SiO_2$ to a gaseous oxy-nitride ($N_xO_y$) to form a silicon oxy-nitride $SiO_xN_y$ gate dielectric. The nitrogen improves the lattice structure of the dielectric so that the dielectric is less susceptible to physical damages resulting from dopants or hot electrons. While the nitrogen incorporation process has shown to improve the gate dielectric properties, precise control of the nitrogen profile within the oxide layer is difficult to achieve because the nitrogen distribution largely depends on proper diffusion of the nitridizing species throughout the oxide.

To address this problem, a method has been developed to incorporate nitrogen in situ by bonding nitrogen to silicon and oxygen to form a $SiO_xN_y$ dielectric from the outset as opposed to diffusing nitrogen through the dielectric after the formation of $SiO_2$. The growth of an in-situ hardened gate oxide typically uses gaseous oxy-nitride $N_xO_y$ as a nitrogen source during the oxide growth process whereas the conventional gate hardening process uses $N_xO_y$ to diffuse nitrogen into an already formed oxide layer. As a result, the $SiO_xN_y$ gate oxide formed using the in-situ method has a more consistent and controlled nitrogen profile. Moreover, the in-situ method incorporates nitrogen into the dielectric at the same time as oxide formation and therefore allows for a reduction in thermal budget and other related processing costs.

Disadvantageously, however, the presence of oxy-nitrides ($N_xO_y$) during gate oxide formation generally precludes the use of chlorine to getter metallic contaminants as chlorine can catalyze an explosive branching chain reaction between $N_xO_y$ and $O_x$. As a result, gettering of metallic contaminants is usually not performed during the growth of in-situ hardened gate dielectrics because of the above mentioned safety concerns. As a consequence, the quality of the in-situ grown $SiO_xN_y$ dielectric is generally inferior when compared to dielectrics that are formed using the conventional dielectric formation process where chlorine can be used during oxide growth to getter metallic contaminants.

Hence from the foregoing, it will be appreciated that there is a need for a method of forming an in-situ hardened dielectric in which chlorine can be safely used to getter metallic contaminants during the formation of the dielectric. Furthermore, it will be appreciated that there is a need for a method of using chlorine and nitrogen simultaneously to getter metallic contaminants and strengthen a dielectric lattice structure without creating a safety hazard. To this end, there is a particular need for a method of forming a nitrogen strengthened $SiO_xN_y$ dielectric in which chlorine can be safely used as a gettering agent during the formation of $SiO_xN_y$.

SUMMARY OF INVENTION

The aforementioned needs are satisfied by the present invention which teaches a method of simultaneously strengthening and gettering a semiconductor dielectric. In one aspect, the present invention comprises a process for producing a gaseous gettering agent selected to getter contaminants in the dielectric and a gaseous strengthening agent selected to strengthen the dielectric. In particular, the gaseous strengthening agent is selected to inhibit rapid oxidation of the gaseous strengthening agent by the gettering agent. Furthermore, the process comprises exposing the dielectric to the gaseous gettering agent and the gaseous strengthening agent so as to strengthen the dielectric while simultaneously gettering the dielectric.

In another aspect, the present invention comprises a process for producing a nitrogen strengthened solid dielectric material in a semiconductor substrate. The process comprises producing a gaseous gettering agent and a gaseous nitridizing agent wherein the gaseous nitridizing agent is produced in a form that is not rapidly oxidizable by the gettering agent. Furthermore, the process comprises oxidizing the semiconductor substrate in the presence of the gaseous gettering agent and the gaseous nitridizing agent such that the gettering agent getters the contaminants and the nitridizing agent bonds nitrogen to the oxidized semiconductor substrate during the oxidation to form a dielectric comprising of the oxidized semiconductor substrate material and the bonded nitrogen. In one embodiment, the process can be applied to the formation of a gate dielectric while in another embodiment the process can be used to strengthen the dielectric of a capacitor.

In yet another aspect, the present invention comprises using an $H_2O$ steam based oxidation system containing dichloroethene (DCE) and ammonia ($NH_3$) to form an in-situ hardened $SiO_xN_y$ gate dielectric. Preferably, the oxidation system comprises 0.001%–1% by volume dichloroethene (DCE) combined with 0.002%–30% by volume ammonia ($NH_3$) in $H_2O$ steam. Preferably, the percent volume of $NH_3$ is at least twice the percent volume of DCE. In contrast to other commonly used in-situ gate oxide growth methods that use $N_xO_y$ as a nitrogen source, the present invention in this aspect uses a steam based $NH_3$ and DCE gas stream as a source for both nitrogen and chlorine during the oxide growth process. In particular, a portion of the $NH_3$ undergoes a gas phase substitution reaction with DCE to release chlorine while the remaining $NH_3$ is decomposed to release nitridizing species for in-situ formation of $SiO_xN_y$. Furthermore, the processing conditions are set to inhibit the formation of $N_xO_y$ species that are potentially explosive in the presence of chlorine. As such, the present invention advantageously provides a source of chlorine that can be safely used during the formation of in-situ hardened $SiO_xN_y$ gate dielectrics.

In one embodiment, the reaction can occur in a furnace batch system or rapid thermal processor (RTP). The gas stream comprising DCE, $NH_3$, and $H_2$ is introduced into the processing system via a hydrogen rich steam that is catalytically or pyrogenically generated. Furthermore, the processing temperature can be approximately between 650–1050 C and the processing pressure approximately between 30 m Torr–19000 Torr. However, it can appreciated that other equipment and processing parameters can be used without departing from the scope of the present invention. Advantageously, the nitrogen and chlorine sources provided by this embodiment are compatible and do not pose a safety hazard when mixed. Furthermore, the present process conserves thermal budget and processing costs by introducing nitrogen and chlorine to the processing environment via the same input stream.

In yet another aspect, the present invention provides a reactant gas that can be safely used to provide both chlorine and nitrogen simultaneously in a semiconductor processing environment. In one embodiment, the reactant gas comprises approximately 0.001% to 1% volume DCE, 0.002%–30% volume $NH_3$, and $H_2O$. Preferably, the percent volume of $NH_3$ is greater than DCE as additional $NH_3$ is needed to provide a source of nitrogen for the process. In one embodiment, the percent volume of $NH_3$ is at least twice that of DCE to ensure that there is sufficient unreacted $NH_3$ to source nitrogen to the system. Preferably, the DCE and $NH_3$ undergo a gas phase substitution reaction in which chlorine is subsequently released. Furthermore, the remaining $NH_3$ is preferably decomposed to release nitrogen to the processing environment. Furthermore, the temperature and pressure of the process are preferably set to inhibit the formation of $N_xO_y$. Preferably, the process temperature is approximately between 650–1050 C and the process pressure is approximately between 30 mT–19000 T. In one embodiment, the process is run at a temperature of 800° C. and a pressure of 760T. Advantageously, the reactant gas can safely source both chlorine and nitrogen to a system and therefore permits the simultaneous introduction of chlorine to various nitrogen incorporation processes without posing a safety hazard.

In another embodiment, the reactant gas comprises 49% ammonia ($NH_3$), 50% water ($H_2O$ ), and 1% DCE (dichloroethene). Similarly, chlorine (Cl—) is released when $NH_3$ is induced to react with DCE and nitrogen (N2) is released from the decomposition of the remaining unreacted $NH_3$. In particular, the nitrogen produced in this embodiment can be used to strengthen a capacitor dielectric comprising $Si_3 N_x$, wherein x<4, by transforming $Si_3N_x$ into $Si_3N_4$ while the chlorine is simultaneously used to getter metallic contaminants. Advantageously, the sources for nitrogen and chlorine provided by this embodiment are compatible from a safety standpoint and therefore can be used simultaneously to strengthen the lattice structure of the dielectric and getter metallic contaminants.

From the foregoing, it will be appreciated that the aspects of the present invention provide a safe method of simultaneously strengthening the lattice structure of a dielectric and gettering metallic contaminants on the substrate surface. In particular, the invention provides a novel method for forming an in-situ hardened $SiO_xN_y$ gate oxide in which the nitrogen sources selected for hardening the dielectric will not be rapidly oxidized by the chlorine source used to getter contaminants. Thus, chlorine can be safely used to getter contaminants during in-situ hardened dielectric formation. Furthermore, the invention also provides a method of using nitrogen to strengthen an already formed $Si_3 N_x$ dielectric while simultaneously using chlorine (Cl—) to getter metallic contaminants. These and other advantages of the present invention will become more apparent from the following description taken in conjunction with the following drawings.

DETAILED DESCRIPTION

Figure 1:
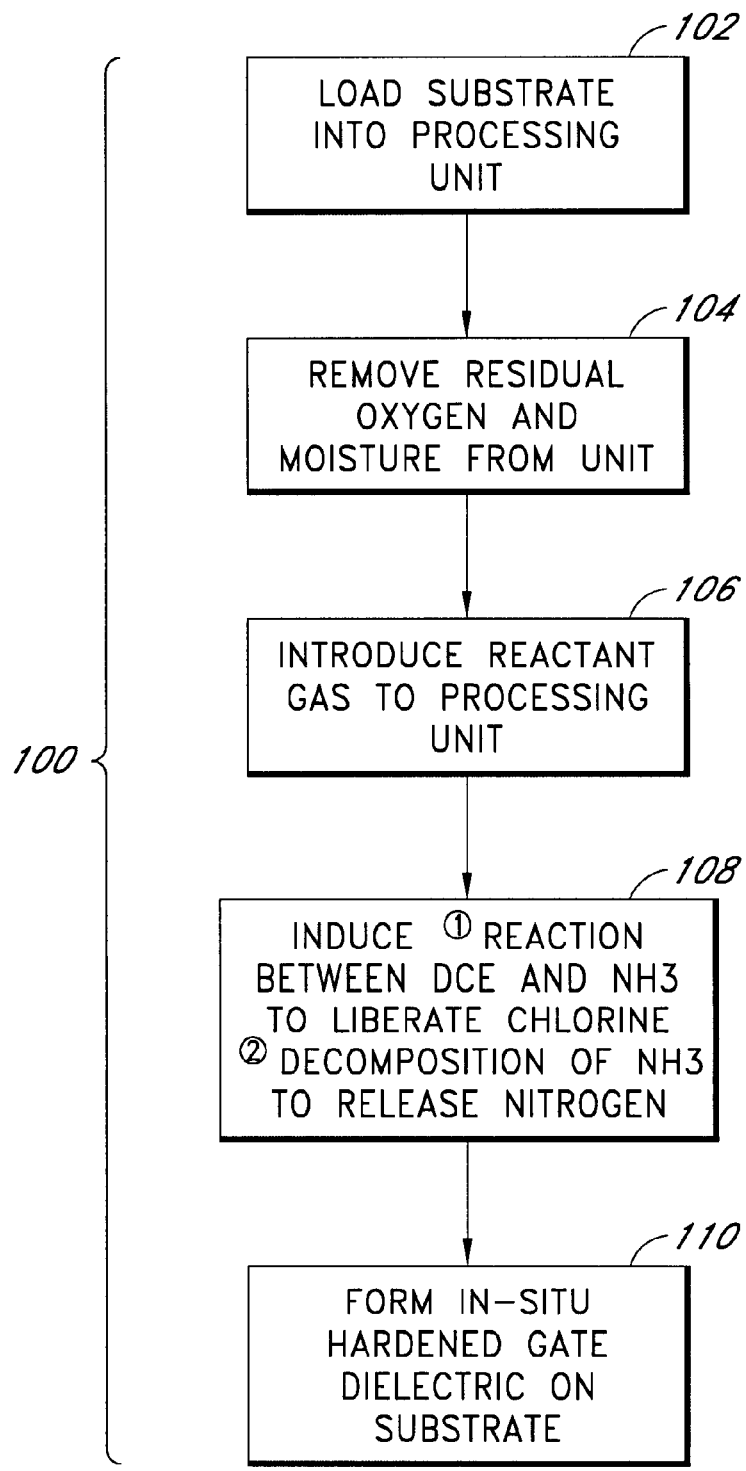
FIG. 1 is a flow diagram illustrating a process flow of the formation of an in-situ hardened gate dielectric in accordance with a preferred embodiment of the present invention.

Reference will now be made to the drawings wherein like numerals refer to like parts throughout. As will be described hereinbelow, the process of the preferred embodiment provides a method of simultaneously strengthening and gettering a semiconductor dielectric. In particular, the preferred embodiment provides a method of forming an in-situ strengthened $SiO_xN_y$ dielectric in which chlorine is used as a gettering agent during the dielectric formation.

FIG. 1 schematically illustrates a process flow 100 of the preferred embodiment of a method of simultaneously strengthening and gettering a semiconductor dielectric. As shown in FIG. 1, the process begins with a first step 102 which comprises loading the substrate into a processing unit that is commonly used in semiconductor fabrication for high temperature processes. In one embodiment, the unit may comprise a furnace batch system while in another embodiment the unit can be a rapid thermal processor (RTP). Moreover, the substrate can be loaded into the processing unit via carriers that are commonly used for such purposes.

Furthermore, the substrate may comprise a single crystalline wafer or other silicon containing surface upon which a gate dielectric is to be formed. As FIG. 1 further shows, a second step 104 of the process 100 comprises flushing the processing unit to remove substantially all residual oxygen and moisture from the inside of the unit. In one embodiment, the RTP unit is cooled to approximately 50 C and flushed with nitrogen gas at a gas flow rate of approximately 20 liters per minute for about 20 seconds. As will be described in greater detail below, oxygen and moisture are preferably purged from the unit to inhibit the formation of $N_xO_y$ which is known to be incompatible with chlorine because chlorine can trigger a rapid oxidation of $N_xO_y$ which can result in an explosion.

As it is also shown in FIG. 1, following the flush cycle of step 104, a third step 106 comprises introducing a stream of reactant gas into the processing unit. In particular, the reactant gas is selected to provide a source of chlorine and nitrogen for gettering and strengthening a semiconductor dielectric. In one embodiment, the reactant gas comprises dichloroethene (DCE), ammonia ($NH_3$), and D.I. water in a hydrogen rich steam. Preferably, the reactant gas comprises approximately 0.001–1% DCE by volume, 0.002% to 30% NH3 by volume while the remaining component substantially comprises water. In one example, the reactant gas comprises 1% DCE by volume, 20% ammonia and 79% steam. Furthermore, it is also preferable that the percent volume of $NH_3$ is at least two times that of DCE to ensure that there is sufficient $NH_3$ to serve both as a source of nitrogen and as a reactant triggering the releases of chlorine from DCE. In yet another embodiment, the reactant gas may comprise DCE, $NH_3$, and $H_2O$ based steam. Preferably, the DCE based reactant gas comprises 1% DCE, 49% $NH_3$, and 50% $H_2O$.

Furthermore, the reactant gas stream is introduced into the processing unit while the unit is set at predetermined processing conditions. Preferably, the process temperature is approximately between 650 C–1050 C and process pressure approximately between 30 mT–19000 Torr. In one embodiment, the temperature is approximately 800° C. and the pressure approximately 760T. Advantageously, the preferred temperature and pressure levels are designed to inhibit the formation of $N_xO_y$ when the gas stream is introduced into the processing unit.

As FIG. 1 further shows, subsequent to the introduction of reactant gas into the processing unit, a gas phase substitution reaction is induced between DCE and $NH_3$ to liberate chlorine from the DCE in the preferred embodiment. However, in other embodiments, DCE can be used to react with $NH_3$ to release chlorine under substantially similar processing conditions. Advantageously, chlorine is compatible with the particular nitrogen source used in the preferred embodiment. In particular, chlorine can be safely mixed with $NH_3$ in an oxygen poor environment whereas chlorine mixed with commonly used nitrogen source such as $N_xO_y$ is known to cause explosions. Subsequent to the release of chlorine, the remaining, unreacted $NH_3$ is thermally decomposed into nitrogen and hydrogen. In the preferred embodiment, the nitrogen is incorporated into the substrate and bonded to the gate oxide during the oxide formation process. However, in other embodiments, the nitrogen can be diffused into an already formed gate oxide or capacitor dielectric to strengthen the lattice structure of the dielectric.

Advantageously, the process of the preferred embodiment conserves thermal budget and other processing costs by utilizing a single source to provide both chlorine and nitrogen for a semiconductor process. Furthermore, the preferred embodiment provides a sources of chlorine that is compatible with the source of nitrogen so that chlorine can be safely used in the presence the nitrogen source. Most conventional processes, on the other hand, generally require two separate steps in order to strengthen and getter the dielectric because chlorine, a commonly used gettering agent, is known to be incompatible with oxy-nitride ($N_xO_y$), a commonly used strengthening agent. Furthermore, in cases where the dielectric is strengthened in-situ with a nitrogen source, gettering usually cannot be performed at all during the dielectric formation process because of the potentially explosive effect. The present invention, however, provides a safe method of using chlorine as a gettering agent during the formation of in-situ nitrogen strengthened dielectric. Furthermore, the present invention also provides a method of using nitrogen and chlorine to simultaneously strengthen and getter an already formed dielectric so as to eliminate an additional processing step.

As FIG. 1 further shows, an in-situ hardened gate oxide is formed in a fifth step of the process 100 of the preferred embodiment. During oxide formation, the substrate is exposed to both the chlorine and nitrogen. Preferably, nitrogen is subsequently incorporated as part of the in-situ dielectric hardening process resulting a layer of $SiO_xN_y$ having a consistent profile is subsequently formed on the substrate surface. Furthermore, the quality of the $SiO_xN_y$ gate dielectric formed is generally improved as chlorine is used during the oxide formation to react with unwanted metals on the substrate surface and therefore reduce oxide defect. In contrast to the conventional methods used to form in-situ hardened gate oxides, the process of the preferred embodiment permits the use of chlorine during oxide growth. As a consequence, the quality of the in-situ hardened oxide formed is generally superior to those formed without the presence of chlorine.

Furthermore, in other embodiments, the fifth step 110 may comprise the strengthening of an already formed semiconductor dielectric such as a $Si_3 N_x$ capacitor dielectric. In particular, the nitrogen released from the decomposition of $NH_3$ is preferably incorporated into the $Si_3 N_x$ (x<4) to form $Si_3 N_4$ so as to strengthen the lattice structure of the dielectric. Furthermore, chlorine liberated from the gas stream is used to getter metallic contaminants during the strengthening process. Advantageously, the present invention can be applied to the formation of an in-situ nitrogen strengthened semiconductor dielectric as well as to nitrogen strengthening of already formed dielectrics.

Although the foregoing description of the preferred embodiment of the present invention has shown, described and pointed out the fundamental novel features of the invention, it will be understood that various omissions, substitutions, and changes in the form of the detail of the process as illustrated as well as the uses thereof, may be made by those skilled in the art, without departing from the spirit of the invention. Consequently, the scope of the present invention should not be limited to the foregoing discussions, but should be defined by the appended claims.

What is claimed is:

1. A process for simultaneously strengthening and gettering a semiconductor dielectric comprising:

producing a gaseous gettering agent selected to getter contaminants in the dielectric;

producing a gaseous strengthening agent so as to strengthen the dielectric while producing the gettering agent wherein the gaseous strengthening agent is selected so as to inhibit rapid oxidation of the gaseous strengthening agent by the gettering agent wherein producing the gaseous gettering agent and producing the gaseous strengthening agent comprise providing a mixture comprising dichloroethene, ammonia, water wherein the volume percent of ammonia is at least twice the volume percent of dichloroethene wherein a substitution reaction is induced between dichloroethene and a first portion of ammonia to release chlorine as the gettering agent and a decomposition reaction is induced in a second portion of ammonia to release nitrogen as the strengthening agent; and simultaneously exposing the dielectric to the gaseous gettering agent and the gaseous strengthening agent so as to strengthen the dielectric while simultaneously gettering the dielectric.

2. The process of claim 1 wherein providing the mixture comprising dichloroethene, ammonia, water comprises providing approximately 1% dichloroethene, 20% ammonia, 79% steam.

3. The process of claim 2 wherein providing the mixture comprises providing a gaseous mixture in a rapid thermal processing chamber wherein the temperature is approximately between 650 C–1050 C and the pressure is approximately between 30 mTorr–19000 Torr.

4. A process for producing a nitrogen strengthened solid dielectric material in a semiconductor substrate comprising:

producing a gaseous gettering agent;

producing a gaseous nitrogen agent wherein the gaseous nitrogen agent being produced in a form that is not rapidly oxidizable by the gettering agent;

oxidizing the semiconductor substrate in the presence of the gaseous gettering agent and the gaseous nitrogen agent such that the gettering agent getters contaminants and the nitrogen bonds with the oxidized semiconductor substrate during the oxidation act such that the dielectric is formed from the oxidized semiconductor substrate material and the bonded nitrogen;

wherein producing the gaseous gettering agent and producing the gaseous strengthening agent comprise providing a mixture comprising dichloroethene, ammonia, water wherein the volume percent of ammonia is at least twice the volume percent of dichloroethene wherein a substitution reaction is induced between dichloroethene and a first portion of ammonia to release chlorine as the gettering agent and a decomposition reaction is induced in a second portion of ammonia to release nitrogen as the strengthening agent.

5. The process of claim 4 wherein providing the mixture comprising dichloroethene, ammonia, water comprises providing approximately 1% dichloroethene, 20% ammonia, 79% steam.

6. The process of claim 4 wherein providing the mixture comprises providing a gaseous mixture in a rapid thermal processing chamber wherein the temperature is approximately between 650 C–1050 C and the pressure is approximately between 30 mTorr–19000 Torr.

7. The process of claim 4 wherein oxidizing the semiconductor substrate comprises forming an in-situ nitrogen strengthened SiOxNy dielectric on the substrate.

8. A process for forming a $SiO_xN_y$ dielectric layer on a silicon substrate surface, the process comprises the steps of:

positioning the silicon substrate in a processing unit;

providing a reactant gas stream comprising dichloroethene (DCE), ammonia ($NH_3$), and $H_2O$ steam to the processing unit wherein providing the reactant gas stream into the processing unit comprises providing a gaseous stream comprising approximately 0.001%–1% DCE by volume and 0.002%–30% $NH_3$;

heating the processing unit to a predetermined elevated temperature;

pressurizing the processing unit to a predetermined pressure;

reacting DCE with ammonia $NH_3$ at the predetermined temperature and pressure to produce chlorine;

decomposing $NH_3$ at the predetermined temperature and pressure to release nitrogen;

using chlorine as a gettering agent to getter contaminants;

using nitrogen as a strengthening agent to strengthen the dielectric layer.

9. The process of claim 8 wherein introducing a reactant gas stream comprises introducing a gas stream that has a percent volume of DCE that is at least twice the percent volume of $NH_3$.

* * * * *